United States Patent [19]
Kase et al.

[11] Patent Number: 5,124,704
[45] Date of Patent: Jun. 23, 1992

[54] MULTI-COMPARATOR A/D CONVERTER WITH CIRCUIT FOR TESTING THE OPERATION THEREOF

[75] Inventors: Kiyoshi Kase, Chiba; Hisashi Sekiguchi, Aizu-wakamatsu, both of Japan

[73] Assignee: Motorola, Inc., Schaumburg, Ill.

[21] Appl. No.: 583,130

[22] Filed: Sep. 17, 1990

[51] Int. Cl.$^5$ .................................... H03M 00/00
[52] U.S. Cl. ............................. 341/120; 341/159
[58] Field of Search .................. 341/120, 159, 160

[56] References Cited
U.S. PATENT DOCUMENTS
4,600,916  7/1986  Masuda et al. ............ 341/159

Primary Examiner—Howard L. Williams
Attorney, Agent, or Firm—Eugene A. Parsons

[57] ABSTRACT

Apparatus and procedure for testing a flash analog-to-digital converter on a chip including a first NOR gate having a plurality of inputs, one each connected to each normal output of the comparators and a second NOR gate having a plurality of inputs, one each connected to each inverted output of the comparators. The output currents of the NOR gates are monitored to determine the states of the comparators when various input voltages are supplied. All comparators are tested for operation.

7 Claims, 3 Drawing Sheets

5,124,704

MULTI-COMPARATOR A/D CONVERTER WITH CIRCUIT FOR TESTING THE OPERATION THEREOF

The present invention pertains to an analog-to-digital (A/D) converter including a test circuit and more specifically to a fast apparatus and method for testing A/D converters on an integrated circuit.

BACKGROUND OF THE INVENTION

Flash A/D converters, semi-flash A/D converters, parallel-sequence A/D converters, and some other types of A/D converters contain large numbers of matched comparators, which number is fixed by the number of bits in the system and the structure of the system. In the case of an 8-bit flash A/D converter, the number of matched comparators is 256.

All of the comparators in the converter must be tested to guarantee the performance of the converter. Normally, A/D converters can be tested by several methods, but all of these methods require multiple test steps for each comparator in the converter. If a resolution of 0.05 for a least significant bit (LSB) is required for the converter, the test steps for each comparator becomes 20. Thus, the total number of steps required to fully test the converter are 5120. If, for example, one millisecond is needed for one test step, the total time required to complete the test of the converter is 5.1 seconds. This test time is very long in mass production. Reducing this test time is a key to production cost reduction.

SUMMARY OF THE INVENTION

It is an object of the present invention to provide new and improved testing apparatus and methods for analog-to-digital converters.

It is a further object of the present invention to provide new and improved testing apparatus and methods which are substantially faster than previous methods.

It is a further object of the present invention to provide new and improved testing apparatus on the semiconductor chip of an integrated analog-to-digital converter, which apparatus can be used to quickly test the analog-to-digital converter.

These and other objects are realized in an analog-to-digital converter including test apparatus comprising a reference voltage ladder, a plurality of matched comparators each having normal and inverted output terminals, a first logic circuit connected to all of the normal output terminals of the comparators, a second logic circuit connected to all of the inverted output terminals of the comparators, and apparatus for monitoring the current output from each of the first and second logic circuits as predetermined input signals are applied to the comparators.

BRIEF DESCRIPTION OF THE DRAWINGS

Referring to the drawings.

DESCRIPTION OF THE PREFERRED EMBODIMENT

Figure 1:
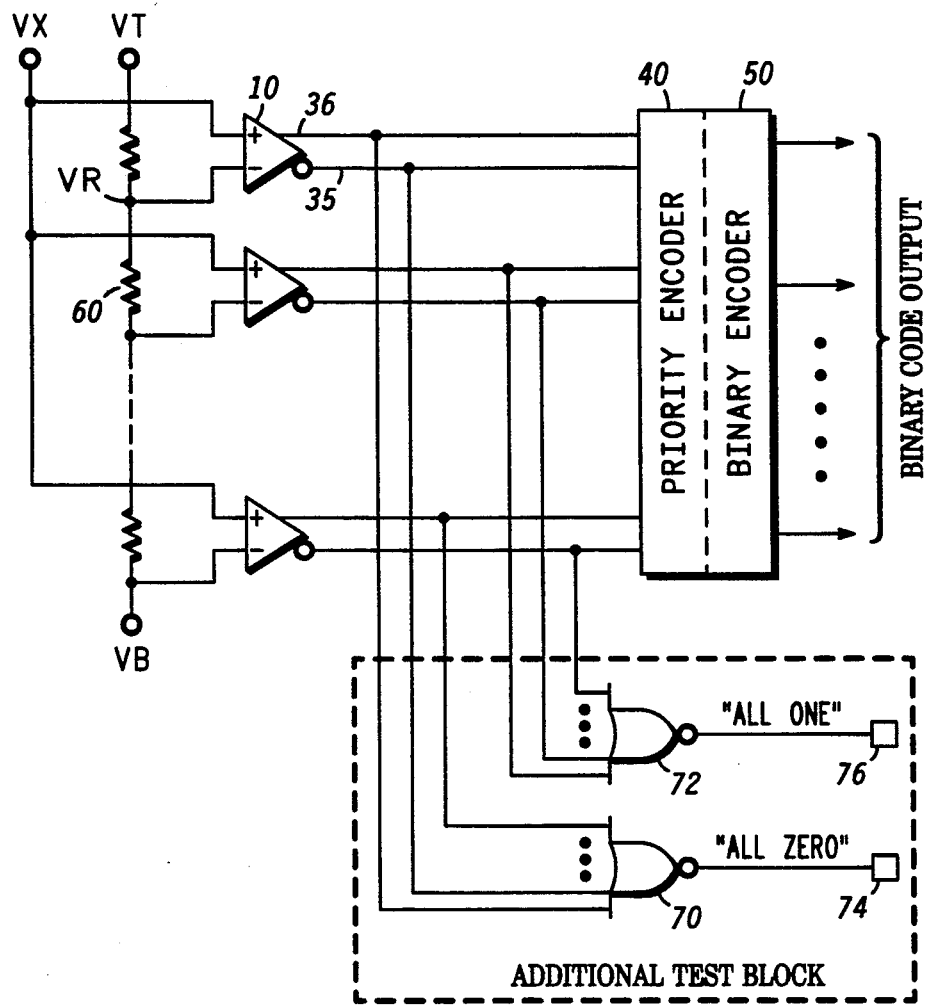
FIG.1 is a schematic diagram of an A/D converter integrated circuit embodying apparatus portions of the present invention.

FIG.1 illustrates a schematic diagram of an analog-to digital (A/D) converter integrated circuit embodying portions of the apparatus for the present invention, which portions are included on a single semiconductor chip. In this specific embodiment the A/D converter is the flash type but it will be understood by those skilled in the art that other types, such as parallel-sequence, etc., might be utilized.

The A/D converter of FIG.1 includes a plurality of comparators, generally designated 10, connected to a priority encoder 40 and binary encoder 50 in the usual manner. The analog input is supplied to one terminal of each of the comparators 10 by way of an input terminal $V_X$. A reference voltage is supplied to input terminals $V_T$ and $V_B$, which are opposite ends of a resistance ladder 60. The reference voltage connected across the resistance ladder provides a voltage ladder, the various steps of which provide a plurality of particular reference voltages $V_R$ which are connected a to second input of each of comparators 10.

Figure 2:
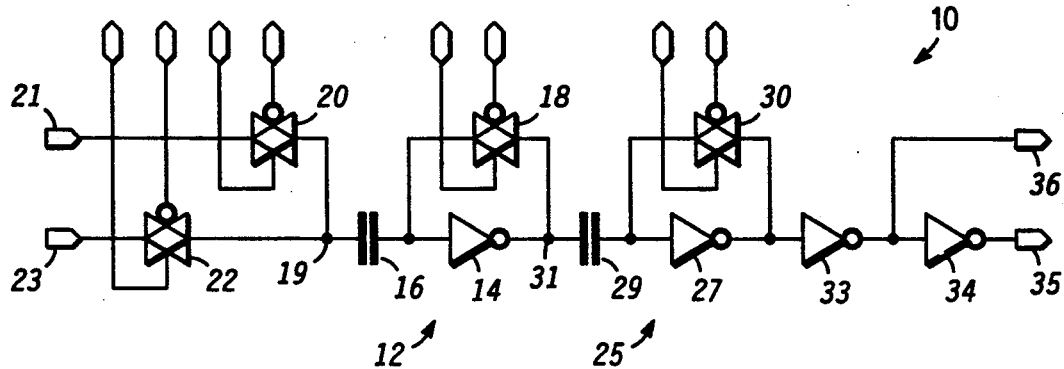
FIG.2 is a schematic diagram of a typical comparator that is used in the structure of FIG.1.

Referring specifically to FIG.2, a typical two stage, chopper type voltage comparator 10 is illustrated. A first stage 12 of voltage comparator 10 includes an inverter 14 and a coupling capacitor 16 connected to an input thereof. A transmission gate switch 18 is connected from the output to the input of inverter 14. One terminal of capacitor 16 is connected to the input of inverter 14 and the other terminal is connected to a comparator input node 19 of the first stage 12. A transmission gate switch 20 is connected between the node 19 and a signal input terminal 21. A transmission gate switch 22 is connected between the node 19 and a reference voltage ($V_R$) input terminal 23.

Comparator 10 has a second stage 25 which includes an inverter 27 and a coupling capacitor 29 connected to an input of inverter 27. A transmission gate switch 30 is connected from the output to the input of inverter 25. One terminal of capacitor 29 is connected to the input of inverter 27 and the other terminal is connected to a comparator input node 31 of the second stage 25. Voltage comparator 10 may have additional inverters 33 and 34 connected in series with the second stage 25, if additional amplification of the output signals is desired. The final, or normal, output signal is available at an output terminal 36 and an inverted output is available at an output terminal 35.

In the operation of voltage comparator 10, switches 18, 20 and 30 are closed while switch 22 remains open. An unknown signal voltage ($V_X$) on input terminal 21 is supplied to voltage comparator 10 (sampled) and stages 12 and 25 are autozeroed to their toggle points. That is, switches 18 and 30 are closed so that first stage 12 and second stage 25 are zeroed at the unknown signal voltage ($V_X$), which is the toggle point for further operation. Switches 18, 20 and 30 are then opened and switch 22 is closed, which supplies the reference voltage ($V_R$) on input terminal 23 to node 19. Since stages 12 and 25 are at their toggle point, if the reference voltage ($V_R$) is greater than the unknown signal voltage ($V_X$) stages 12 and 25 will toggle in a first direction and a one, in this example a positive output, will be available at output 36, while a zero or ground potential signal will be available at output terminal 35. If the reference voltage is less than the unknown signal voltage stages 12 and 25 will toggle in a second direction and a zero will be available at output 36 while a one will be available at output terminal 35. Inverters 14 and 27 operate to provide some signal gain, with one stage being on the order of 12.5 and two stages being approximately 120. Thus a comparison between the unknown signal voltage and a reference voltage is provided by voltage comparator 10 and the amount of signal gain required will determine the number of stages utilized.

While the above explained operation is correct, it will be understood that each comparator 10 may have slightly different characteristics, even though they are all formed on the same semiconductor chip and are considered to be matched. Because of these potential differences, production limitations are normally specified. These specifications include limits for $V_X > V_R$ and $V_X < V_R$ at which the comparator will provide an output. Thus a test must be made on each comparator 10 to determine if it comes within the production limitations. If a comparator in an integrated circuit does not come within the specified limitations the integrated circuit must be discarded. The test apparatus included in the integrated circuit and the procedure described below is capable of completely testing each comparator 10 in the integrated circuit in a minimum number of steps.

All of the normal output terminals 36 of comparators 10 are connected to inputs of a logic circuit, which in this embodiment is a NOR gate 70, having a separate input for the normal output of each comparator 10. In the previously stated example, an eight bit converter requires 255 comparators and, in that example, NOR gate 70 has 255 inputs. Similarly, each inverted output terminal 35 of comparators 10 is connected to a separate input of another logic circuit 72.

Figure 3:
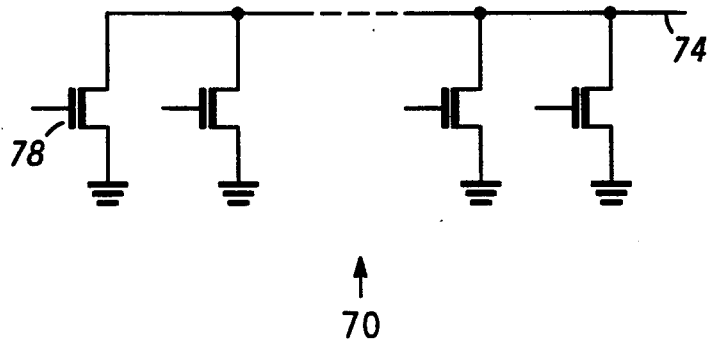
FIG.3 is a schematic diagram of a portion of a logic circuit illustrated in FIG.1.

In the present embodiment, each of the NOR gates 70 and 72 include a plurality of field effect transistors (FETs) 78 connected in parallel, as illustrated in FIG.3. FETs 78 each have a drain connected to an external voltage supply, which is actually the output of the logic circuit, and a source connected to a reference potential, in this embodiment ground. NOR gates 70 and 72, and the connections to comparators 10 are included in the integrated circuit and outputs of NOR gates 70 and 72 are output terminals 74 and 76, respectively, of the integrated circuit. The gates of FETs 78 are the input terminals to each of NOR gates 70 and 72, which are connected to the output terminals of comparators 10. In this embodiment, the particular FETs utilized each draw 10 microamperes when turned on. Thus, in the above example, 255 FETs will draw a total of 2.55 milliamperes when they are all turned on.

Figure 4:
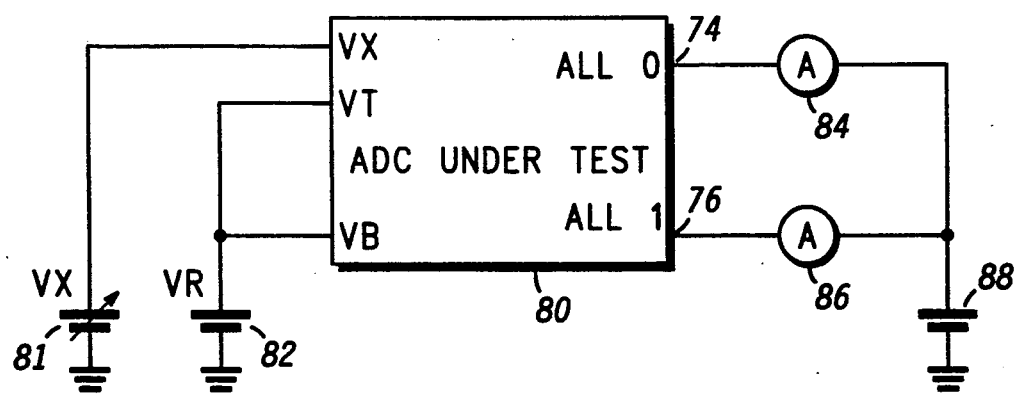
FIG.4 is a schematic/block diagram of a test set-up for the structure of FIG.1.

Referring specifically to FIG.4, a histogram current monitor test circuit is illustrated. In this particular arrangement the integrated circuit of FIG.1, designated 80, has a variable voltage source 81 connected to the signal input terminal $V_X$ thereof. A reference voltage source 82 is connected to both of the reference voltage source input terminals $V_T$ and $V_B$ of integrated circuit 80. One side of an ammeter 84 is connected to output terminal 74 of integrated circuit 80 and the other side is connected to a power supply 88. Also, one side of a second ammeter 86 is connected to output terminal 76 of integrated circuit 80 and the other side is connected to power supply 88. The usual timing and power connections to integrated circuit 80 are not shown since these are well known in the art and do not form a portion of this invention.

To fully test each of the comparators in integrated circuit 80 the following procedure is followed. NOR gate 70 provides an "all zero" output, i.e. only comparators that recognize $V_X > V_R$ and provide a positive (1) output will turn on one of FETs 78 in NOR gate 70 and contribute current to output 74. Similarly, NOR gate 72 provides an "all one" output since only comparators that recognize $V_X < V_R$ and provide a low (0) output will turn on one of FETs 78 in NOR gate 72 and contribute current to output 76. Since all of the signal input terminals of comparators 10 are connected to variable voltage supply 81 and since all of the reference voltage input terminals of comparators 10 are connected to voltage source 82, to test all of comparators 10 variable voltage source 81 is simply stepped through a range of voltages from the lowest acceptable production limit to the highest acceptable production limit. The variation can be, for example, from $V_R - 1.0\text{LSB}$ equivalent voltage to $V_R + 1.0\text{LSB}$ equivalent voltage. Further, the test may consist simply of three steps, the upper production limit, the center and the lower production limit, or the test may consist of as many as 20 steps with a minimum test step of 0.05LSB being selected.

Figure 5:
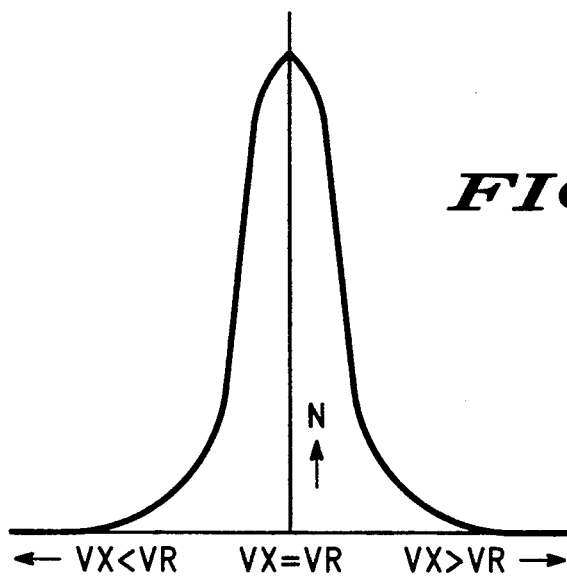
FIGS.5 through 7 are graphical representations of histograms produced by the test set-up of FIG.4.

FIG.5 is a histogram of the output currents measured in ammeters 84 and 86 as variable voltage source 81 is varied from a point $V_X < V_R$ to a point $V_X > V_R$, with N representing the number of comparators that are turned on. If all comparators are operating correctly, N will be maximum at $V_X = V_R$ and drop to zero within the production limits. Since the operator will know the amount of current drawn by one of FETs 78 in logic gate 70 or 72, it is a simple matter to determine the number of comparators 10 that are turned on (or off) at any setting of variable voltage source 81. This test can easily be computerized and made either automatic or virtually automatic.

Figure 6:
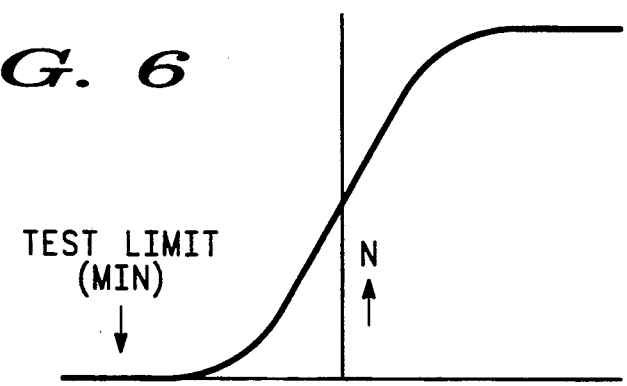
Figure 7:
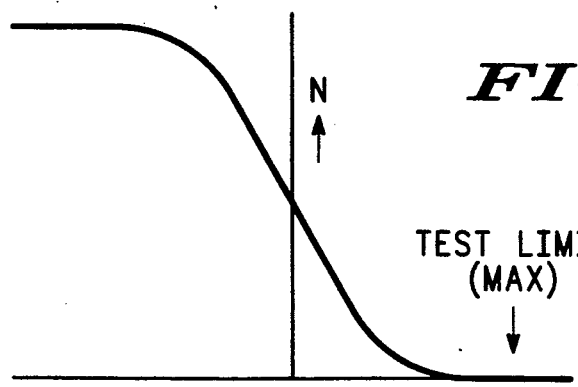

FIGS.6 and 7 illustrate histograms for outputs 74 and 76, respectively. A high speed go/no-go test can easily be developed by utilizing such histograms. Output current in output terminal 74 will be turned on by the most positive offset comparator 10 when $V_X < V_R + \text{offset}$ is applied to signal input $V_X$. The output current in output terminal 74 can be used as an "underflow" indicator. Similarly output current in output terminal 76 will be turned on by the most negative offset comparator 10 when $V_X > V_R - \text{offset}$ is applied. The ouput current in output terminal 76 can be used as an "overflow" indicator. +/−offset or +/− DNL (differential nonlinearity) is specified by the production limitations or the data sheets of the integrated circuit. Therefore, two tests can guarantee the DNL at a $V_R$. Multiple points are needed to guarantee the common mode range, which is the same as $V_T$ and $V_B$ reference voltage of the A/D converter. Three points, however, are enough for the common mode operation test.

Thus, a new and improved A/D converter incorporating logic circuitry for the high speed test thereof has been disclosed. Further, additional apparatus and improved methods of testing the A/D converter are disclosed. The prior art methods of testing A/D converters required multiple tests on each comparator which could result in, for example, 5120 tests for a simple 8-bit flash A/D converter. The present apparatus and methods can fully test the same converter in 1/256 of the steps. Assuming a test time of 1 microsecond per step, the present apparatus and method can test an A/D converter in 20 microseconds versus 5.1 seconds for the prior methods. This is a substantial improvement and can greatly reduce production time and costs.

While we have shown and described specific embodiments of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

What we claim is:

1. An analog-to-digital converter including test apparatus comprising:
   a reference voltage ladder adapted to have a reference voltage connected thereacross;
   a plurality of matched comparators each having a first input terminal adapted to be connected to a predetermined reference voltage on said ladder, a second input terminal adapted to receive an input signal to be converted to a digital signal, a normal output terminal and an inverted output terminal;
   a first logic circuit having a plurality of input terminals, one each connected to each of the normal output terminals of said comparators;
   a second logic circuit having a plurality of input terminals, one each connected to each of the inverted output terminals of said comparators; and
   one of said first and second logic circuits providing a signal on an output terminal thereof indicative of the number of said comparators in which the applied reference voltage exceeds the input signal and the other of said first and second logic circuits providing a signal on an output terminal thereof indicative of the number of said comparators in which the applied reference voltage is less than the input signal.

2. An analog-to-digital converter including test apparatus as claimed in claim 1 wherein the reference voltage ladder, plurality of comparators, first and second logic circuits and the connections therebetween are provided on a single semiconductor chip.

3. An analog-to-digital converter including test apparatus as claimed in claim 1 wherein the first logic circuit has a plurality of input terminals, one each connected to each normal output of the plurality of comparators for providing an output signal indicative of the underflow current of the converter for a specific input signal and the second logic circuit has a plurality of input terminals, one each connected to each inverted output of the plurality of comparators for providing an output signal indicative of the overflow current of the converter for the specific input signal.

4. An analog-to-digital converter including test apparatus as claimed in claim 3 wherein the first logic circuit includes a first NOR gate and the second logic circuit includes a second NOR gate.

5. A method of testing an analog-to-digital converter including a plurality of comparators comprising the steps of:
   providing normal and inverted outputs from each of the comparators;
   providing a first logic circuit having a plurality of input terminals connected to receive one each of the normal output signals from the plurality of comparators;
   providing a second logic circuit having a plurality of input terminals connected to receive one each of the inverted output signals from the plurality of comparators;
   supplying a reference voltage and a predetermined number and variety of input signals to each of the plurality of comparators; and
   monitoring the amount of output current at outputs of each of the first and second logic circuits for each of the predetermined number and variety of input signals supplied to the comparators.

6. A method of testing an analog-to-digital converter including a plurality of comparators as claimed in claim 5 wherein the comparators, first and second logic circuits and the connections therebetween are provided on a single semiconductor chip and one output terminal is provided on the chip for an output of the first logic circuit and a second output terminal is provided on the chip for an output of the second logic circuit.

7. A method of testing an analog-to-digital converter including a plurality of comparators as claimed in claim 5 wherein the step of supplying the reference voltage and the predetermined number and variety of input signals includes the step of supplying the same reference voltage and the same input signals to each of the comparators simultaneously.

* * * * *